United States Patent
Göth et al.

(10) Patent No.: US 11,850,661 B2
(45) Date of Patent: Dec. 26, 2023

(54) METHOD OF SEGMENTING OBJECT TO BE MANUFACTURED BY ENERGY INPUT PARAMETER AND PASSING ENERGY BEAM ACROSS SEGMENTS

(71) Applicant: EOS GmbH Electro Optical Systems, Krailling (DE)

(72) Inventors: Michael Göth, Munich (DE); Ludger Hümmeler, Gauting (DE); Alexander Bockstaller, Stockdorf (DE)

(73) Assignee: EOS GmbH Electro Optical Systems, Krailling (DE)

( * ) Notice: Subject to any disclaimer, the term of this patent is extended or adjusted under 35 U.S.C. 154(b) by 481 days.

(21) Appl. No.: 16/636,699

(22) PCT Filed: Aug. 2, 2018

(86) PCT No.: PCT/EP2018/071079
§ 371 (c)(1),
(2) Date: Feb. 5, 2020

(87) PCT Pub. No.: WO2019/030127
PCT Pub. Date: Feb. 14, 2019

(65) Prior Publication Data
US 2020/0164437 A1    May 28, 2020

(30) Foreign Application Priority Data
Aug. 7, 2017  (DE) .................. 102017213720.7

(51) Int. Cl.
*B22F 10/85*    (2021.01)
*B33Y 50/02*    (2015.01)
(Continued)

(52) U.S. Cl.
CPC .............. *B22F 10/85* (2021.01); *B22F 10/36* (2021.01); *B22F 10/38* (2021.01); *B33Y 10/00* (2014.12);
(Continued)

(58) Field of Classification Search
CPC .......... B22F 10/20; B22F 10/36; B22F 10/85; B22F 10/30; B22F 10/28; B22F 10/38;
(Continued)

(56) References Cited

U.S. PATENT DOCUMENTS 6,730,256 B1    5/2004  Bloomstein
2007/0035069 A1    2/2007  Wust et al.
(Continued)

FOREIGN PATENT DOCUMENTS

CN    103231055    8/2013
CN    104175556    12/2014
(Continued)

OTHER PUBLICATIONS

International Search Report for Application No. PCT/EP2018/071079, dated Nov. 12, 2018, 6 pages.
(Continued)

*Primary Examiner* — Kenneth M Lo
*Assistant Examiner* — Jonathan Michael Skrzycki
(74) *Attorney, Agent, or Firm* — Seyfarth Shaw LLP

(57) ABSTRACT

Disclosed is a method for providing control data for an additive manufacturing device. The method includes accessing computer-based model data of a section of the object to be manufactured, defining a first portion and an adjoining second portion within the object section, and producing a data model of a region of a layer of the object section. Within the region a first portion cross-section cuts through the first portion and a second portion cross-section cuts through the second portion. An energy input parameter in the data model
(Continued)

has, on average, a different value in the first portion cross-section than in the second portion cross-section and the energy beam is moved over the boundary of the first and second portion. Control data corresponding to the data model is provided for the generation of a control data set for the additive manufacturing device.

12 Claims, 11 Drawing Sheets

(51) Int. Cl.
  *B22F 10/36* (2021.01)
  *B33Y 10/00* (2015.01)
  *B33Y 30/00* (2015.01)
  *G06F 30/17* (2020.01)
  *B22F 10/38* (2021.01)
  *B22F 10/28* (2021.01)

(52) U.S. Cl.
  CPC .............. *B33Y 30/00* (2014.12); *B33Y 50/02* (2014.12); *G06F 30/17* (2020.01); *B22F 10/28* (2021.01)

(58) Field of Classification Search
  CPC ......... B33Y 10/00; B33Y 30/00; B33Y 50/02; G06F 30/17; G06F 30/00; Y02P 10/25; B29C 64/153; B29C 64/393
  See application file for complete search history.

(56) References Cited

U.S. PATENT DOCUMENTS

| | | | |
|---|---|---|---|
| 2013/0060535 A1 | 3/2013 | Fruth | |
| 2014/0348691 A1* | 11/2014 | Ljungblad | B22F 12/45 419/53 |
| 2015/0145177 A1 | 5/2015 | El-Siblani et al. | |
| 2015/0211083 A1* | 7/2015 | Gabilondo | C21D 6/00 219/121.73 |
| 2016/0052087 A1* | 2/2016 | O'Neill | B22F 10/28 219/76.12 |
| 2016/0059352 A1* | 3/2016 | Sparks | B33Y 50/02 219/76.14 |
| 2016/0167131 A1* | 6/2016 | Weilhammer | B29C 64/124 264/401 |
| 2016/0193696 A1 | 7/2016 | McFarland et al. | |
| 2016/0263832 A1 | 9/2016 | Bui et al. | |
| 2017/0165751 A1 | 6/2017 | Buller et al. | |
| 2017/0216971 A1* | 8/2017 | DeMuth | B22F 12/41 |
| 2018/0210984 A1 | 7/2018 | Herzog | |
| 2018/0345414 A1* | 12/2018 | Revan | B33Y 10/00 |

FOREIGN PATENT DOCUMENTS

| | | |
|---|---|---|
| CN | 105750543 | 7/2016 |
| CN | 106808681 | 6/2017 |
| DE | 102005027311 | 11/2006 |
| DE | 102011105045 | 6/2012 |
| DE | 102015112918 | 2/2017 |
| EP | 2565018 | 3/2013 |
| EP | 3127635 | 2/2017 |
| WO | 2015000854 | 1/2015 |

OTHER PUBLICATIONS

D. D. Gu et al.: Laser additive manufacturing of metallic components: materials, processes and mechanisms, International Materials Reviews, vol. 57, No. 3, May 1, 2012, p. 133-164, XP055420443, US ISSN 0959-6608, DOI: 10.1179/1743280411Y.0000000014 (English), 33 pages.

* cited by examiner 51  55  52

METHOD OF SEGMENTING OBJECT TO BE MANUFACTURED BY ENERGY INPUT PARAMETER AND PASSING ENERGY BEAM ACROSS SEGMENTS

TECHNICAL FIELD OF THE INVENTION

The invention refers to a method and a device of providing control data for an additive manufacturing apparatus, a respectively adapted additive manufacturing method, a respectively adapted additive manufacturing apparatus and a respectively adapted computer program.

BACKGROUND OF THE INVENTION

Additive manufacturing apparatus and corresponding methods are generally characterized in that objects are manufactured in them layer by layer by means of a solidification of a shapeless building material. For example, the solidification can be effected by means of a supply of heat energy to the building material by irradiating the same with electromagnetic radiation or particle radiation (e.g. laser sintering (SLS or DMLS) or laser melting or electron beam melting) or else by effecting a cross-linking reaction in the building material (e.g. stereolithography).

The European patent application EP 2 565 018 A1 addresses the problem that in the layer-wise manufacturing of parts by means of additive manufacturing methods stress occurs during cooling-down and curing, respectively, of the building materials, which stress may lead to a warping of the parts. In order to solve this problem, it is suggested to section the part to be manufactured into 3D volume regions that are each built separately by solidifying the building material. Here, the goal is an optimization of the size and shape of the volume regions as well as in particular the topography of the outer surfaces of the volume regions such that stress arising after the completion of the part becomes minimal. Here, either a gap between two volume regions is provided or else volume regions are allowed to overlap.

SUMMARY OF THE INVENTION

The inventors have found that by introducing volume regions in the object to be manufactured, with each volume region being solidified separately and, as the case may be, also with differing material solidification parameters, there may be problems with respect to homogeneity, in particular strength, at positions at which volume regions are abutting each other. Therefore, it is an object of the present invention to provide a method and a device by which the homogeneity of objects manufactured by an additive manufacturing method can be improved.

The object is achieved by means of a computer-based method, an additive manufacturing method, a device, a computer program and an additive manufacturing apparatus Moreover, the features described in connection with one device may also be used for a further development of another device according to the invention, even if this is not explicitly stated.

An inventive computer-based method of providing control data for an additive manufacturing apparatus for manufacturing a three-dimensional object, wherein by means of the additive manufacturing apparatus the object is manufactured by applying a building material layer by layer and by solidifying the building material by supplying radiant energy to positions in each layer that are assigned to the cross-section of the object in that layer in that by an energy input unit these positions are scanned with at least one energy beam so that energy is input into the building material according to a set of energy input parameters, comprises:
  a first step of accessing computer-based model data of at least one portion of the object to be manufactured,
  a second step of determining a first partial region and a second partial region inside of the at least one object portion, which are abutting each other at a border,
  a third step of generating at least one data model of a region of a building material layer to be selectively solidified in order to manufacture the at least one object portion, in which a first partial region cross-section is cutting the first partial region and a second partial region cross-section is cutting the second partial region, wherein it is specified in the data model that in said first partial region cross-section at least one energy input parameter on average has a different value than in said second partial region cross-section and that the at least one energy beam is moved across the border at least once while inputting energy into the building material by the at least one energy beam, and
  a fourth step, in which control data are provided for the generation of a control dataset for the additive manufacturing apparatus, said control data corresponding to the at least one data model generated in the third step.

Additive manufacturing apparatus and methods to which the present invention refers are in particular those in which energy is selectively supplied to a layer of the building material as electromagnetic radiation or particle radiation. Here, the working plane is a plane located in the upper side of that layer to which the energy is supplied. Here, the energy input unit may for example comprise a laser or an electron beam source. However, also a UV light source as it is used in particular in stereolithography would be conceivable. While in stereolithography a solidification of the building material is effected in that the radiation acting on the building material causes a cross-linking reaction in the same, in other methods, in particular in laser sintering or laser melting and electron beam melting, respectively, heat is supplied to the building material. Here, the building material is partially or completely melted by means of the energy input by the radiation, so that the constituents of the building material (for example powder grains) coalesce. After its cooling-down, the building material then exists in a solid state. As the transitions between superficial melting (sintering) and complete melting (melting) are smooth, the terms "sintering" and "melting" are synonymously used in the present application and no difference is made between sintering and melting.

If in this application layers are mentioned that are below or above of an object cross-section, this indication of a direction refers to a direction which is substantially perpendicular to the layer planes and perpendicular to the construction plane, respectively. The term "substantially" here expresses the fact that in some cases the layer thickness may not be uniform, e.g. the layer thickness may monotonically change across the object cross-section. In this respect, it is assumed that below-lying layers are applied earlier in time than above-lying layers and therefore are located below the above-lying layers.

Here, it shall also be remarked that by means of an inventive additive manufacturing apparatus not only one object but also a plurality of objects can be simultaneously manufactured. If in the present application the manufacturing of an object is mentioned, it is self-evident that the corresponding description is in the same way applicable also to additive manufacturing methods and apparatus, in which several objects are manufactured at the same time.

Here, a control dataset (often also termed "control command set") is regarded to be a sequence of instructions to subsequently apply layers of the building material and to scan regions of the respective layers that correspond to the cross-section of an object to be manufactured with energy radiation in order to solidify the building material.

In detail, a control dataset is based on a computer-based model of the object(s) to be manufactured, preferably a CAD model. During manufacture, the control dataset specifies for each building material layer in particular the thickness of the layer applied and the positions at which a solidification of the building material shall be effected by a supply of radiation. Furthermore, a control dataset often also includes manufacturing-specific information, for example with respect to the position and orientation of the objects in the additive manufacturing apparatus or with respect to a diameter of the energy beam when impinging on the building material. Usually, the control dataset contains all data that are necessary for a control of the energy input device, whereby the energy density of the energy radiation or the velocity of movement of the beam across the building material and/or an irradiation pattern are determined.

Thus, the control dataset can be regarded as entirety of all control data that are specified for the control of the manufacturing process in an additive manufacturing apparatus. In the following, the control data related to a single layer are also referred to as layer dataset. In particular, in the present application a layer dataset is assumed to contain a data model of positions to be solidified during the manufacturing process of an object cross-section. Such a data model usually is generated by dividing a CAD model of the object to be manufactured into layers (in technical jargon named "slicing"). However, it is also conceivable to extract a two-dimensional representation of the object cross-section, which is to be solidified in a layer by means of one or more beams, from the computer-based CAD model of the object in a different way. In the layer dataset, positions corresponding to an object cross-section which are to be solidified in the corresponding building material layer, are specified. Furthermore, still further information with regard to the manufacturing of the object cross-section may be included, in particular the temporal sequence by which positions corresponding to an object cross-section are to be solidified, or e.g. the layer thickness or irradiation parameter values such as the diameter or the velocity of movement of a beam impinging on the building material, etc. It shall be emphasized that there also exist special cases, in which a layer dataset does not refer to a complete object cross-section, but only to a part of the same.

The computer-based model data may for example be a CAD model of the object portion to be manufactured, which exists e.g. in STL format and does not yet include information on the sectioning into layers for a layer-wise manufacturing, or they may be a number of layer datasets. Here, it shall be remarked that in the present application the term "number" always is to be understood as having the sense "one or more". Moreover, it shall be remarked that the object portion need not necessarily refer to a part of the object to be manufactured but may also comprise the complete object to be manufactured.

An access of the model data may be a reading of the model data from a memory or a receipt of the model data via a network. Here, the model data of the complete object portion need not necessarily be read at once. It is also possible that there is a larger time-lag between the events at which parts of the model data are accessed. For example, parts of the model data each can be imported when needed during a manufacturing process of an object, wherein a generated data model then is integrated into the control dataset during the manufacturing process.

If in the model data of the object portion energy input parameter values have already been specified, in the second step preferably the first partial region and the second partial regions will be determined such that in the first partial region at least one energy input parameter has on average a different value than in the second partial region. Preferably, each partial region stretches across a plurality of building material layers to be applied during its manufacture.

If energy input parameters that have already been specified in the model data have a plurality of values and vary much, respectively, inside of the object portion, meaning vary on particular on a small scale, preferably in the second step not an arbitrary multitude of partial regions is defined. Rather, only a limited number of partial regions is defined, which differ from one another in that the value of at least one energy input parameter is different at least on average. For example, in practice a partial region may be defined by the fact that the energy input parameter values inside of the same do not exceed a predetermined fluctuation level.

If the model data of the object portion already comprise a number of layer datasets, the generation of at least one data model in the third step may consist of a change of a data model of a building material layer already existing in the model data. Otherwise, a data model of a building material layer may be generated for the first time in the third step, wherein in the first partial region cross-section for at least one energy input parameter on average a different value is specified than in the second partial region cross-section.

Moreover, it shall be emphasized that in the third step a data model of a building material layer is generated, in which the border between the first and the second partial region at least partially lies inside of the object portion. In other words, a data model of a building material layer is generated, in which the border between the first and the second partial region during the building process at least partially does not lie above of unsolidified building material and is not covered by unsolidified building material. In other words, in the third step a data model of a building material layer is generated, in which layer the border between the first and the second partial region lies at least partially, preferably completely, above of positions to be solidified in the underlying layer and below of positions to be solidified in the underlying layer. This is achieved by the first partial region cross-section cutting the first partial region and the second partial region cross-section cutting the second partial region. The term "cutting" here expresses the fact that in the generated data model neither the first partial region cross-section nor the second partial region cross-section coincides with a bottom surface or a top surface of the first partial region and the second partial region, respectively. By this specification, the border between the first and the second partial region automatically lies at least partially inside of the object portion.

In a data model generated in the third step it is not specified that each partial region cross-section at first is completely scanned with an energy beam, before an adjoining partial region cross-section is scanned with the energy beam. Rather, it is specified that an energy beam is moved substantially continuously, i.e. without stopping, across the border between the first and the second partial region and between the first and the second partial region cross-section, respectively. Thus, the energy beam at first scans positions in the first partial region cross-section and during the scanning of the building material, i.e. substantially without interrupting the energy supply to the building material, crosses the border to the second partial region cross-section, in order to scan positions in the second partial region cross-section based on a modified value of at least one energy input parameter.

If the energy beam has a two-dimensional region of incidence on the building material and the working surface, respectively, meaning its region of incidence is not substantially point-shaped, a movement of the energy beam across the border means in particular that the region of incidence of the energy beam on the building material crosses the border completely. Thus, preferably the energy beam is moved into the other partial region (cross-section) to such an extent that the building material in the other partial region (cross-section) is scanned not only close to the border. In other words, the first partial region cross-section and the second partial region cross-section are scanned with the energy beam in one go, meaning substantially without temporal interruption of the movement at the border. Thus, a scanline, meaning the scanned line on the building material and in the working plane, respectively, in the second partial region cross-section is scanned immediately after a scanline in the first partial region cross-section. Preferably, the whole first and second partial region cross-sections are scanned in this way.

It shall be remarked that the control data provided for the generation of a control dataset on the one hand may consist of the at least one data model itself that was generated in the third step. On the other hand, however, the at least one data model may be further processed in accordance with the format requirements of the control command set.

By the approach according to the invention, the energy may be input into the building material as uniformly as possible in spite of different values of an energy input parameter in two partial regions abutting each other. Thereby, it is possible to avoid abrupt changes of parameters of properties in the finished object at the border between the partial regions in different partial regions of an object cross-section in which energy is input with different values of at least one energy input parameter. The more uniform solidification due to such an approach may in particular provide for smooth changes of parameters of properties of the object. Here, a larger homogeneity of the manufactured object at a transition inside of the same is understood by the present application as having in particular smaller shifts of a property of the object at this transition. By the described approach, steps in mechanical parameters such as the elongation at break may be lowered or avoided. Thereby, it can be made sure that the manufactured objects e.g. have a higher strength. For example, a more uniform quality of a crystal structure of an object generated in a metal-based additive manufacturing process may be achieved. Of course, the approach according to the invention is not limited to two partial regions abutting each other and having differing energy input parameter values. Rather, it is applicable to all partial regions abutting one another in an object each having different energy input parameter values.

In practice, small disturbances may occur when an energy beam, in particular a laser beam of electron beam is moved. Such small disturbances may be attributed to delayed responses of the mechanics or electronics of the energy input unit. These effects can also be accepted for the approach according to the invention. In any case, the just described method aims at moving an energy beam as continuously as possible across the border between two partial regions. Short-term interruptions of the energy beam, e.g. when changing an energy input parameter, need to be tolerated, however, are not intended in accordance with the invention. As long as such interruptions lie below one or more microseconds, preferably below 10 µs, they can be tolerated within the scope of the invention. Even interruptions of several 10 µs are still acceptable in some cases.

In a variation of the approach, in the first step model data are accessed that comprise a number of layer datasets, wherein each layer dataset comprises a data model of a region of a building material layer to be selectively solidified during the manufacturing, such region corresponding to a cross-section of the object portion.

This already mentioned variation of the approach makes the method simpler as it is possible to resort to already existing layer datasets, which are merely altered. If in particular energy input parameter values have already been specified in the layer datasets, preferably the first and second partial region may be defined in the second step such that in the first partial region at least one energy input parameter on average has a different value than in the second partial region.

Preferably, the value of at least one energy input parameter is changed inside of a border region, said border region being a region on at least one side of the border in said building material layer described by the data model, the positions to be solidified in said region having a maximum distance of 2000 µm, more preferably 1500 µm, even more preferably 1000 µm, even further preferably 100 µm, most preferably 50 µm, to the border.

If an energy beam moves across the border between the first and second partial region (cross-section) in one go, somewhere down the way the value of an energy input parameter has to be changed as in the second partial region (cross-section) the value of at least one energy input parameter on average is different than in the first partial region (cross-section). Preferably, this change of at least one energy input parameter value is made in a border region close to the border. The dimension of the border region inside of which the parameter is advantageously changed depends i.a. on the system inertia of the energy input unit used in the particular case. For example, for a high velocity of movement of the energy beam usually a larger dimension of the border region perpendicular to the border will be chosen. As the border between the first partial region cross-section and the second partial region cross-section in a top view need not necessarily be a straight line, the spatial distance or maximum spatial distance to the border will be advantageously defined perpendicularly to the border for a position to be solidified. If the border region is defined such that is has a comparatively large dimension perpendicularly to the border, energy input parameter values can be changed at different positions inside the border region (meaning at varying distances to the border). Thereby a blending of regions that were solidified with different energy input parameter values results. The advantage will be that the energy input parameter values will not be changed at an exact border line which after the completion of the object might possibly turn out to be a weak spot (predetermined break line).

Further preferably, the value of at least one energy input parameter is changed immediately when crossing the border.

If in different partial regions of the object to be manufactured different values of energy input parameters are specified, it is appropriate to change energy input parameter values immediately at the border between partial regions, though an energy beam is moved without interruption across the border. How quickly an energy input parameter may in fact be changed in the process depends on the performance of the technical equipment. In the control data, a change at the border between two partial regions is aimed at. If necessary, delays due to the technical equipment are taken into consideration by specifying an altered value of an energy input parameter for the energy beam already when the energy beam has not yet reached the border. Then, a change of the energy input parameter occurs as near as possible to the border, meaning when the energy beam moves across the border (when the border is crossed), due to possibly existing delays due to the technical equipment. Even if the area of incidence of an energy beam on the building material is not point-shaped, but rather has a two-dimensional extension, a change of a value of an energy input parameter when the border is crossed can be scheduled such that during the movement of the area of incidence across the border the value of the energy input parameter is changed. In each case, the method refers to the specification of the control data for the energy input unit, thus in particular to the position specifications and coordinate specifications that are given to the energy input unit by the control data.

As an alternative to the just described approach, the value of at least one energy input parameter can be gradually changed inside of said border region.

Even if it is of course desirable to specify in the partial regions having different values of an energy input parameter the exact value of this energy input parameter at all positions, in practice it may be easier to change the value of an energy input parameter inside of a border region not abruptly but gradually. On the one hand, this can mean that the value of an energy input parameter is changed in several steps from the value inside of the first partial region (cross-section) towards the value inside of the second partial region (cross-section). Alternatively, the value of an energy input parameter is substantially continuously changed from the value inside of the first partial region (cross-section) towards the value inside of the second partial region (cross-section).

Here, a "substantially continuous" change is mentioned, as in practice a continuous change (implying an infinite number of steps) is not possible. In practice there always exists a maximum rate at which the value of an energy input parameter can be changed. As here the value of an energy input parameter is changed substantially during the movement of the energy beam, during the change of the energy input parameter value the area of incidence of the energy beam moves a bit further. Therefore, in practice, the energy input will change in steps even if a continuous change of the value of an energy input parameter was intended. It shall be additionally mentioned that the control data also cannot specify differing values of an energy input parameter with an arbitrarily fine granularity. In practice there will always be specifications of discrete values.

Further preferably, the at least one energy beam scans the building material in said first partial region cross-section along first scan lines and scans the building material in said second partial region cross-section along second scan lines, wherein in said border region, in particular at the border, first scan lines in the first partial region cross-section are running in the same direction as second scan lines in the second partial region cross-section.

Usually, the positions inside of an object cross-section are solidified such that at least one energy beam is moved across the building material along scanlines that are substantially in parallel, preferably in parallel, to one another. Here, the scanlines have a pitch that is specified such that the building material in the region scanned by the scanlines is solidified as uniformly as possible. Here, a distance between two neighboring scanlines is defined for example as distance between the line centers in a direction perpendicular to the line. In the just described approach, the direction in which the scanlines run, is kept at the border and in the border region, respectively, thus is not changed, so that at the border between both partial regions no steps in the material properties and the mechanical parameters, respectively, of the solidified object occur, if possible. Preferably, this is not only applicable to one scanline but to all scanlines that cross the border. Within the scope of this application, direction means the orientation in the plane of the cross-section of the object and not the direction of movement of the energy beam on a scanline. Here, it shall be remarked that out of reasons of a better distinction those scanlines that are located in the first partial region cross-section are designated as first scanlines and those scanlines that are located in the second partial region cross-section are designated as second scanlines independent of changes of the direction of the scanlines or changes of an energy input parameter during the movement of the area of incidence of the energy beam on the scanline, thus along the predetermined scanned distance.

Alternatively, the at least one energy beam scans the building material in said first partial region cross-section along first scan lines and scans the building material in said second partial region cross-section along second scan lines, wherein in said border region, in particular at the border, said first scan lines and said second scan lines are at an angle relative to one another that is different from 0°.

When regions of an object cross-section are scanned along scanlines, in practice sometimes there is no identical energy amount input per unit area at all positions along a scanline. Rather, the value of the input energy amount per unit area depends also on the shape of the corresponding partial region. Here, there may also be preferred directions of the scanlines depending on the shape of a region.

In particular, in the border region, in particular at the border, the first scanlines and the second scanlines may be at an angle relative to one another that is smaller than 30°, preferably smaller than 10°, more preferably smaller than 1°.

With regard to a homogeneity at the borders between partial regions that is as high as possible, there exists preferably a maximum angle between the directions of the first scanlines in the first partial region cross-section and the second scanlines in the second partial region cross-section.

In particular, the directions of the first scan lines and/or of the second scan lines can be gradually changed inside of the border region.

In order to arrive at a solidification of the material that is as uniform as possible in the transition from the first partial region to the second partial region, it is advantageous to gradually change the direction in which an energy beam is moved along a first scanline in the first partial region cross-section, so that the energy beam is moved in a different direction along a second scanline in the second partial region cross-section. In other words, the direction in which an energy beam is moved is successively changed when the energy beam is moved from the first partial region cross-section to the second partial region cross-section. On the one hand it is conceivable that the direction of movement of the energy beam is changed two times, three times or several times inside of the border region. However, it is also conceivable that the direction of the movement of the energy beam is nearly continuously changed within the border region, i.e. in many steps and therefore nearly steplessly. Thereby, it is possible that an energy beam is moved inside of the first partial region cross-section along first scanlines and is moved within the second partial region cross-section along second scanlines and that the direction in which the scanlines run is continuously changed in the border region when crossing over from the first partial region cross-section to the second partial region cross-section. By avoiding an abrupt change of the direction of movement of the energy beam, it is possible to provide for a more uniform solidification of the building material inside of the border region. Moreover, such an approach may also lead to a gain in speed or a gain in time when energy input units are used in which abrupt changes of the direction are only possible by a time-consuming deceleration and acceleration due to the mechanical inertia of the beam deflection unit. Again, the method described is preferably applied to all first scanlines in the first partial region cross-section that cross the border.

In particular, the at least one energy beam may scan the building material in said first partial region cross-section along first scan lines and may scan the building material in said second partial region cross-section along second scan lines, wherein in said border region, in particular immediately at the border, said first scan lines and/or said second scan lines are displaced by an amount that is smaller than half the pitch of the first scan lines or the second scan lines.

Particularly when the scanline pitch of the first scanlines in the first partial region cross-section differs from the scanline pitch of the second scanlines in the second partial region cross-section, the case may occur in which a first scanline and a second scanline exactly meet at the border, however, the respective adjacent first and second scanlines do not exactly meet at the border. Likewise, in the case that the scanline pitch in the first partial region cross-section and in the second partial region cross-section is equal, however the directions of the first scanlines in the first partial region cross-section are different from the directions of the second scanlines in the second partial region cross-section, it may happen that not all scanline pairs of a first scanline and a second scanline cross at the border or in the border region. From this results that at the border or inside of the border region there is a displacement of first and second scanlines, which refers to the distance between the point of intersection of a first scanline with the border and the point of intersection of a second scanline with the border and with an edge of the border region, respectively. An intersection of a scanline with the border is for example a point at which the center of the scanline with regard to a direction perpendicular to the curve of the scanline crosses the border. However, for an adequate uniformity of the solidification of the building material it is sufficient if such a displacement of a first scanline with respect to a second scanline is smaller than half the pitch of the first or second scanlines. Here, a scanline pitch is defined as the distance between the line centers of two adjacent scanlines in a direction perpendicular to the direction in which the two scanlines run.

Though in some cases it may be sufficient to provide for an adequate uniformity in the solidification at the border between the first partial region cross-section and the second partial region cross-section only locally, it is nevertheless advantageous if the mentioned condition applies to all first and second scanlines which have an intersection with the border.

In particular, the at least one energy beam may scan the building material in said first partial region cross-section along first scan lines and may scan the building material in said second partial region cross-section along second scan lines, wherein the pitch of the first scan lines in the first partial region cross-section equals the pitch of the second scan lines in the second partial region cross-section.

Again with regard to a solidification that is as uniform as possible, for the second partial region cross-section the same scanline density like for the first partial region cross-section is set. If the first and second scanlines are in parallel to each other, this may be easily implemented. In other cases, for example a gradual change of the scanline directions in the border region can provide for an equal scanline pitch in the first partial region cross-section and the second partial region cross-section.

Optionally, the pitch of the first scanlines in the first partial region cross-section may differ from the pitch of the second scanlines in the second partial cross-section. Preferably this applies to all scanlines in the first and second partial region cross-section that cross the border. In particular, the building material in the second partial region cross-section can be intentionally solidified with a different scanline pitch. A motive for this may be for example that different values of energy input parameters are intended in the second partial region cross-section.

In particular, data models of n+1 consecutive building material layers can be generated, n being a natural number, wherein in the data models of n consecutive building material layers a scanning of the building material with the at least one energy beam is specified only in the first partial region cross-section but not in the second partial region cross-section and in the in the data model of the following (n+1)-th building material layer a scanning of the building material in the first partial region cross-section and in the second partial region cross-section is specified.

According to such an approach, a solidification in both partial region cross-sections with at least one energy input parameter that differs on average is specified only in the n+1-th layer. Then, for the solidification of the second partial region cross-section in the n+1-th layer the energy input parameters are set such that when the n+1-th layer is scanned in the second partial region cross-section, the building material in the n prior layers in the second partial region cross-section is also solidified. However, as a result, other energy input parameters than in the first partial region cross-section must be set in the second partial region cross-section. Nevertheless, when the energy beam is moved across the border during the input of energy (meaning in one go), it is possible to provide for a uniform solidification at the border between the two partial regions.

By the approach it is possible to provide in the first partial region structures with a higher resolution than in the second partial region. If for example the first partial region includes surface regions of the object to be manufactured for which a post-processing is difficult, these surface regions may be built with a higher precision than the interior of the object for which a high resolution of details is not important. For example, the interior of the object maybe made by solidifying several layers at once with a high energy density and/or a high velocity and/or a large diameter of the area of incidence of the radiation on the layer.

In an inventive additive manufacturing method for manufacturing a three-dimensional object, wherein the object is manufactured by applying a building material layer by layer and by solidifying the building material by supplying radiant energy to positions in each layer that are assigned to the cross-section of the object in that layer in that these positions are scanned with at least one energy beam so that energy is input into the building material according to a set of energy input parameters, the process of the additive manufacturing method is controlled by a control dataset generated using a method of providing control data according to the invention.

If control data that are provided according to the invention are used in a control dataset that was generated for the control of an additive manufacturing method, in particular the control of a layer-wise additive manufacturing method such as a layer-wise powder-melting or sintering method as e.g. SLS or DMLS, objects with properties that are as uniform as possible, i.e. without local steps of parameters of properties of the object such as the elongation at break, the surface roughness, the color, etc., can be manufactured.

An inventive device of providing control data for an additive manufacturing apparatus for manufacturing a three-dimensional object, wherein the object is manufactured by means of the additive manufacturing apparatus by applying a building material layer by layer and by solidifying the building material by supplying radiant energy to positions in each layer that are assigned to the cross-section of the object in that layer in that by an energy input unit these positions are scanned with at least one energy beam so that energy is input into the building material according to a set of energy input parameters, comprises:

a data access unit configured to access computer-based model data of at least one portion of the object to be manufactured, a segmentation unit configured to determine a first partial region and a second partial region inside of the at least one object portion, which are abutting each other at a border, a data model generation unit that is configured to generate at least one data model of a region of a building material layer to be selectively solidified in order to manufacture the at least one object portion, in which a first partial region cross-section is cutting the first partial region and a second partial region cross-section is cutting the second partial region, wherein it is specified in the data model that in said first partial region cross-section at least one energy input parameter on average has a different value than in said second partial region cross-section and that the at least one energy beam is moved across the border at least once while inputting energy into the building material by the at least one energy beam, and a control data provision unit that is configured to provide control data for the generation of a control dataset for the additive manufacturing apparatus, said control data corresponding to the at least one data model generated by the data model generation unit.

The provision of the data model generated in the third step for the generation of a control dataset can e.g. be done by the control date provision unit itself in that the same integrates the generated data model into a control dataset for the additive manufacturing apparatus. However, a provision also comprises a transfer of the data model to a data processing device that integrates the data model into a control dataset or a direct transfer to an additive manufacturing apparatus. In particular, it is possible to dynamically provide data models for object cross-sections still to be manufactured to an additive manufacturing apparatus during a manufacturing process in the same. In particular, data models generated in the third step need not be provided individually for an additive manufacturing process. Rather, also several generated data models may at first be collected and then be provided in their entirety for an integration into a control dataset.

An inventive computer program having program code means to perform all steps of a method according to a method of providing control data according to the invention when the computer program is executed by a data processor, in particular a data processor interacting with an additive manufacturing apparatus.

"Interacting" means here that the data processor either is integrated in the layer-wise additive manufacturing apparatus or is able to exchange data with it. The implementation of the inventive method of providing control data and of the respective device by means of software makes an easy installability on different computing systems at different locations possible (for example at the creator of the design of the object or else at the operator of the additive manufacturing apparatus).

An inventive additive manufacturing apparatus for manufacturing a three-dimensional object, wherein the object is manufactured in the additive manufacturing apparatus by applying a building material layer by layer and by solidifying the building material by supplying radiant energy to positions in each layer that are assigned to the cross-section of the object in that layer in that these positions are scanned with at least one energy beam so that energy is input into the building material according to a set of energy input parameters, wherein said additive manufacturing apparatus comprises:

a layer application unit configured to apply a layer of a building material onto a building material layer that already exists and preferably has already been selectively solidified, an energy input unit configured to scan with at least one energy beam the positions in a layer assigned to the cross-section of the object, and a control unit configured to execute a computer program according to the invention in order to control the manufacture of the object.

BRIEF DESCRIPTION OF THE DRAWINGS

Further features and practicalities of the invention will arise from the description of embodiments based on the attached drawings.

DETAILED DESCRIPTION OF THE EMBODIMENTS

Figure 1:
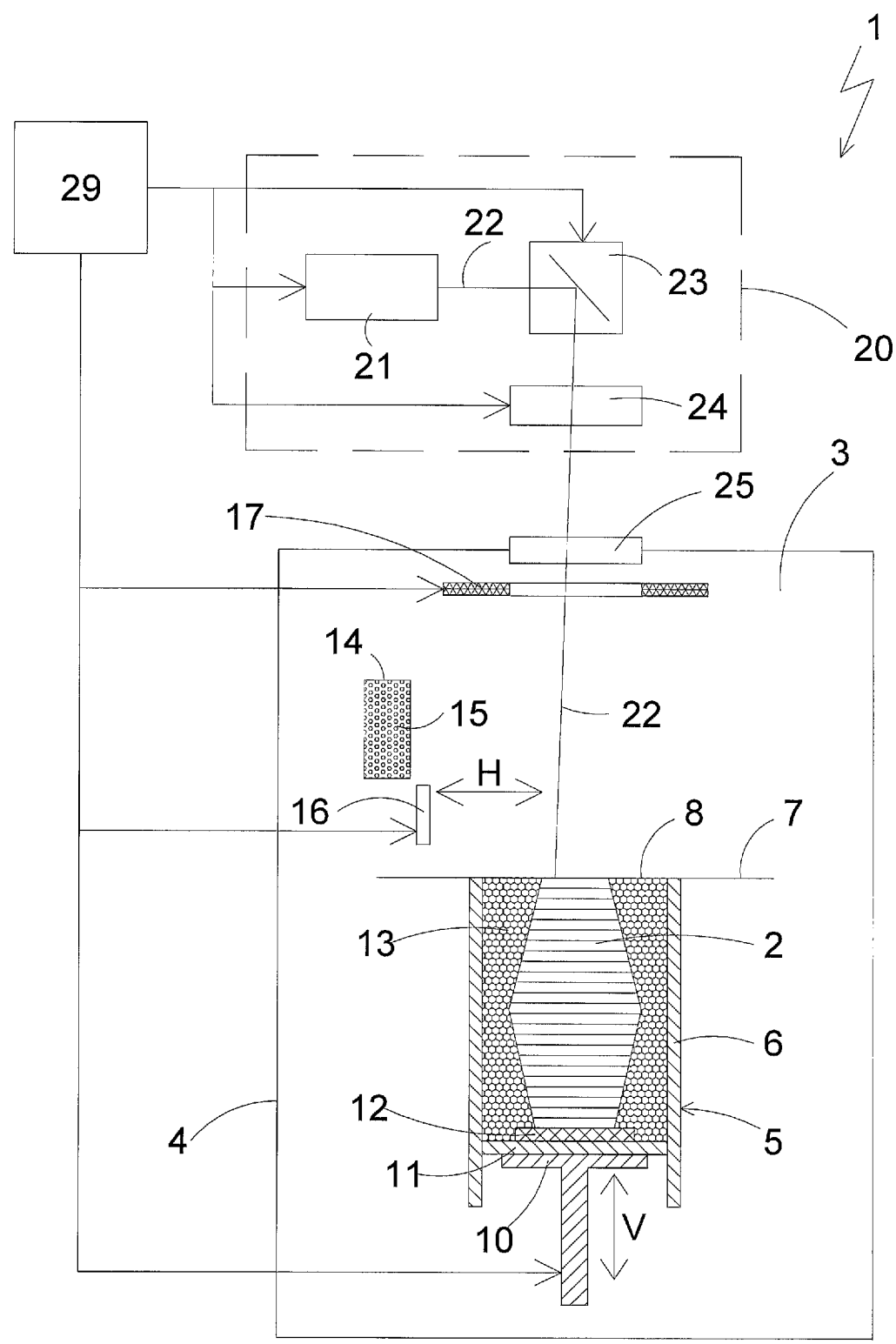
FIG. 1 shows a schematic, partially cross-sectional view of an exemplary apparatus for an additive manufacture of a three-dimensional object according to an embodiment of the invention.

In the following, for a description of the invention at first an additive manufacturing apparatus according to the invention shall be described at the example of a laser sintering apparatus or laser melting apparatus with reference to FIG. 1.

For building an object 2, the laser sintering or laser melting apparatus 1 comprises a process chamber or build chamber 3 having a chamber wall 4. A build container 5 open to the top and having a container wall 6 is arranged in the process chamber 3. A working plane 7 is defined by the top opening of the build container 5, wherein the area of the working plane 7 located within the opening, which area can be used for building the object 2, is referred to as build area 8.

In the build container 5, a support 10 is arranged that can be moved in a vertical direction V and to which a base plate 11 is attached which seals the container 5 at the bottom and thus forms the bottom thereof. The base plate 11 can be a plate formed separately from the support 10, which is fixed to the support 10, or it can be integrally formed with the support 10. Depending on the powder and process used, a building platform 12 as building support on which the object 2 is built can be additionally arranged on the base plate 11. However, the object 2 can also be built on the base plate 11 itself, which then serves as a building support. In FIG. 1, the object 2 to be formed in the container 5 on the building platform 12 is shown below the working plane 7 in an intermediate state with several solidified layers, surrounded by building material 13 that remained unsolidified.

The laser sintering or melting apparatus 1 further comprises a storage container 14 for a building material 15, in this example a powder that can be solidified by electromagnetic radiation, and a recoater 16 that can be moved in a horizontal direction H for applying building material 15 within the build area 8. Optionally, a heating device, e.g. a radiant heater 17, can be arranged in the process chamber 3 for heating the applied building material. For example, an infrared heater can be provided as radiant heater 17.

The exemplary additive manufacturing apparatus 1 further comprises an energy input unit 20 having a laser 21 generating a laser beam 22 that is deflected by a deflection device 23 and focused by a focusing device 24 on the working plane 7 through a coupling window 25 that is arranged at the top side of the process chamber 3 in the chamber wall 4.

In laser sintering or laser melting, an energy input unit can for example comprise one or more gas or solid-state lasers or any other laser types such as laser diodes, in particular VCSEL (Vertical Cavity Surface Emitting Laser) or VECSEL (Vertical External Cavity Surface Emitting Laser) or a line of these lasers. Therefore, the specific setup of a laser sintering device or laser melting device shown in FIG. 1 is only exemplary for the present invention and may of course be modified, in particular when using a different energy input unit than the one that is shown. In order to indicate that the shape of the area of incidence of the radiation on the building material need not necessarily be approximately point-shaped, but may also be two-dimensional, in this application often the term "beam" is used synonymously to "ray".

The laser sintering apparatus 1 additionally comprises a control unit 29 by which the individual components of the apparatus 1 can be controlled in a coordinated manner in order to carry out the building process. Alternatively, the control unit can also be arranged in parts or completely outside of the device. The control unit can comprise a CPU, the operation of which is controlled by a computer program (software). The computer program can be stored separately from the additive manufacturing apparatus in a storage device from where it can be loaded (e.g. via a network) into the additive manufacturing apparatus, in particular into the control unit.

In operation, the support 10 is lowered layer by layer by the control unit 29, the recoater 16 is controlled such that a new powder layer is applied and the deflection device 23 and as the case may be also the laser 21 and/or the focusing device 24 are controlled such that for a solidification of the respective layer at the positions corresponding to the respective object these positions are scanned with the laser.

All statements made further down do not only apply to laser sintering apparatus or laser melting apparatus but also to additive manufacturing apparatus of other types, in which heat energy is input into the building material by way of radiation.

In the additive manufacturing apparatus that was just described by way of example, a manufacturing process proceeds such that the control unit 29 processes a control dataset (often also designated as "control command set").

By the control dataset, it is specified for an energy input unit, in the case of the above laser sintering or laser melting apparatus specifically for the deflection device 23, at which position of the working plane 7 the energy radiation has to be directed at each point in time during the solidification process. Of course, in practice there will exist inertia of the deflection device 23, so that when changing the point or area of incidence of the laser beam 22 on the working plane 7 by means of the deflection device 23, it will not be possible to move the point or area of incidence across the working plane 7 with an arbitrarily high velocity. Also, if it is for example not possible to move the point of incidence of the laser beam 22 across the working plane 7 in arbitrarily small curve radiuses due to inertia of the deflection device 23, this has no effect on the idea of the present invention. The invention aims at a change of the control data. Measures that are additionally necessary due to the inertia of for example a beam deflection device, can be made independently of the approach according to the present invention.

Figure 10:
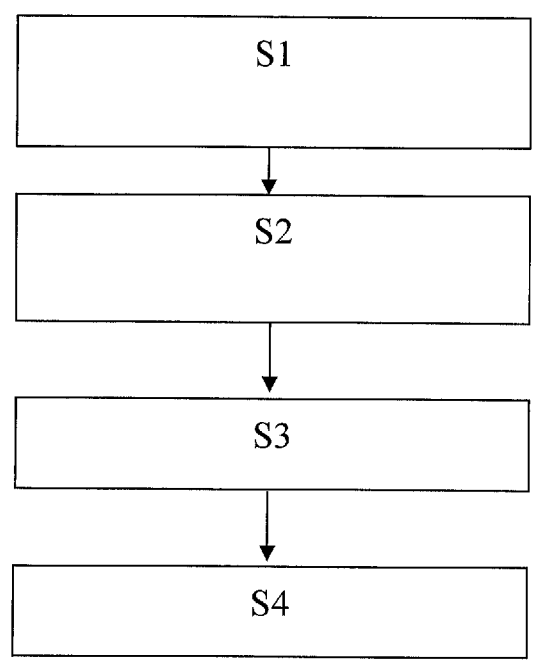
FIG. 10 illustrates the process of a method of providing control data.
Figure 11:
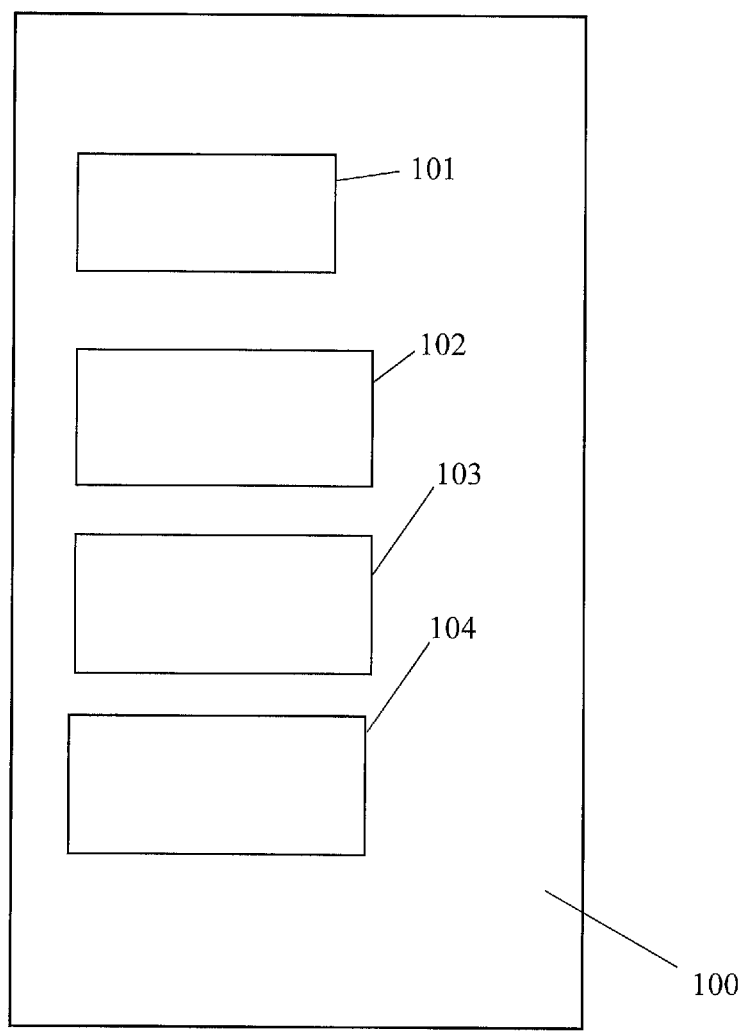
FIG. 11 shows the schematic setup of a device of providing control data.

As shown in FIG. 11, a device 100 for providing control data for an additive manufacturing apparatus comprises a data access unit 101, a segmentation unit 102, a data model generation unit 103 and a control data provision unit 104. The operating mode of the device 100 for providing control data will be described by making reference to FIG. 10.

In the device 100 for providing control data for an additive manufacturing apparatus shown in FIG. 11, at first the data access unit 101 accesses a number of layer datasets, meaning one or more, each of which comprises a data model of a region of a building material layer to be solidified during the manufacture, preferably of the whole region to be solidified of a building material layer, which corresponds to a cross-section of an object portion. In the process sequence shown in FIG. 10 this is the first step S1.

Figure 2:
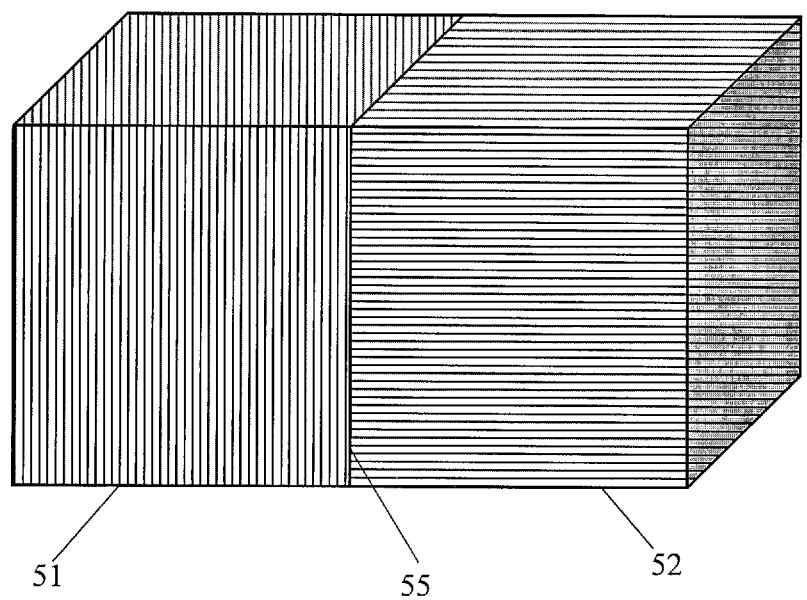
FIG. 2 schematically shows an exemplary segmentation of an object to be manufactured into partial regions according to the invention.

In a second step S2 shown in FIG. 10, the segmentation unit 102 determines partial regions of an object and object portion, respectively, for which different values of at least one energy input parameter in the solidification of the building material are specified. FIG. 2 schematically shows a segmentation of the object 2 to be manufactured into a first partial region 51 and a second partial region 52. The reason for choosing different energy input parameters in different partial regions may for example be conditioned by the geometry of the partial regions or else by different building material parameters at different positions of the construction field 7. In this embodiment it is assumed that the information on the energy input parameters already exists in the layer datasets which the data access unit 101 accesses.

In the third step S3 shown in FIG. 10, the data model generation unit 103 specifies in at least one data model in which at least a first partial region cross-section 51a and a second partial region cross-section 52a that are abutting each other exist, how at least one energy beam has to be moved across the two partial region cross-sections 51a and 52a. In other words, a temporal sequence of the scanning of the individual positions of the first partial region cross-section 51a and the second partial region cross-section 52a with energy radiation is determined. In the process it is specified that the direction of movement of an energy beam is not inverted at the border 55 between the first partial region cross-section 51a and the second partial region cross-section 52a. Rather, the energy beam is moved across the border 55 in one go while energy radiation is supplied to the building material. The procedure is exemplarily shown in FIG. 3.

Figure 3:
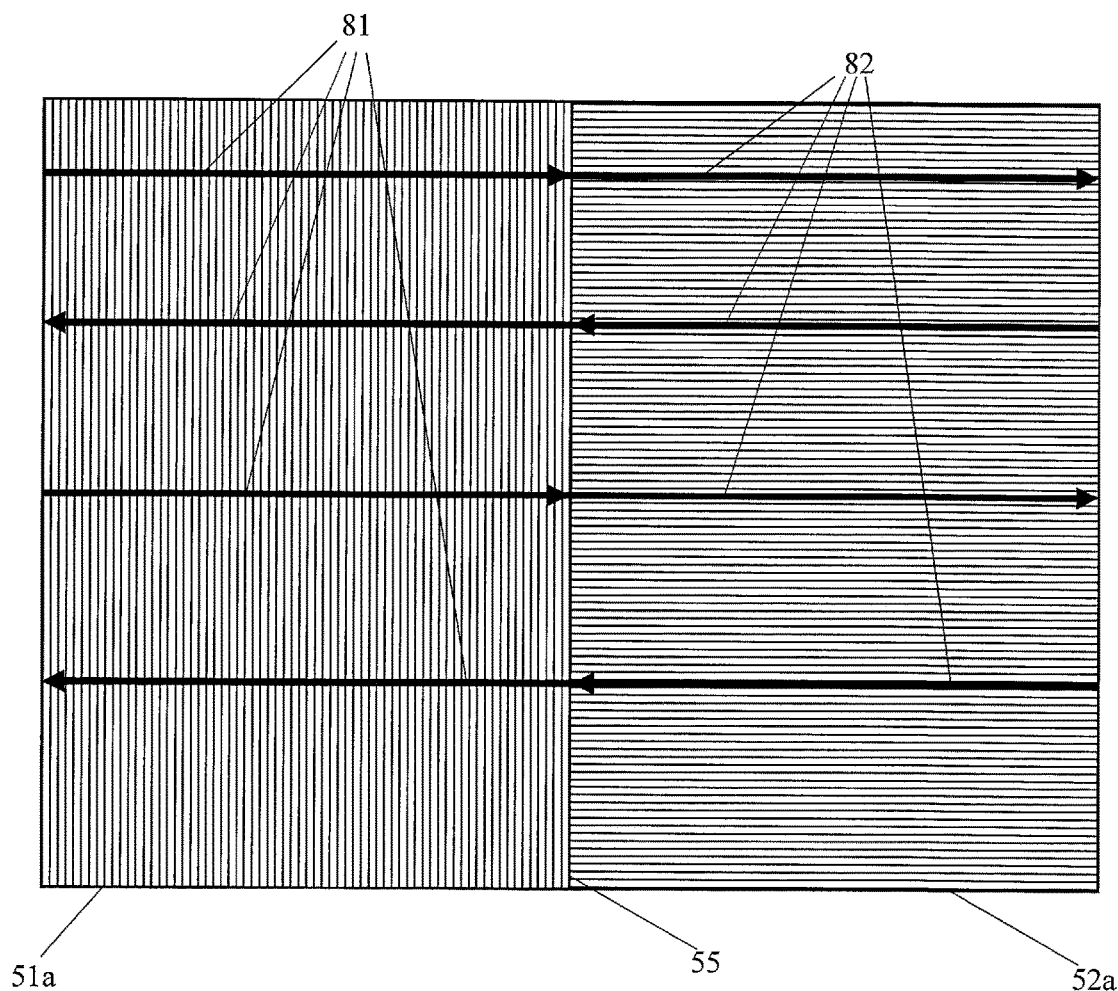
FIG. 3 schematically shows a horizontal cut through the object shown in FIG. 2.

FIG. 3 schematically shows a horizontal cut through the object shown in FIG. 2. Accordingly, in FIG. 3 a top view of a first partial region cross-section 51a and a second partial region cross-section 52a, which have a rectangular shape and abut each other at a border 55, can be seen. Furthermore, scanlines 81 in the first partial region cross-section 51a and scanlines 82 in the second partial region cross-section 52a can be seen. The scanlines are paths along which the area of incidence of an energy beam on a building material layer is moved across the layer. Here, the arrows in FIG. 3 indicate the direction of movement of the energy beam, wherein it is assumed in the example that for the first partial region cross-section 51a the same energy beam as for the second partial region cross-section 52a is used for the solidification, which, however, need not necessarily be so. Here, a first scanline 81 without interruption becomes a second scanline 82. The differentiation between the first scanlines 81 and second scanlines 82 is only made in order to indicate in which of the two partial region cross-sections 51a and 52a the area of incidence of the energy beam is located. If it is assumed that the area of incidence of the energy beam has a certain extent, one can for example define that the area of incidence of the energy beam is located in that partial region cross-section in which the larger percentage of area of the area of incidence is located at a certain instant.

As in the two partial region cross-sections 51a and 52a at least one energy input parameter is specified differently, the data model generation unit 103 specifies a change of this at least one energy input parameter such as the laser power when the border 55 is crossed.

Figure 4:
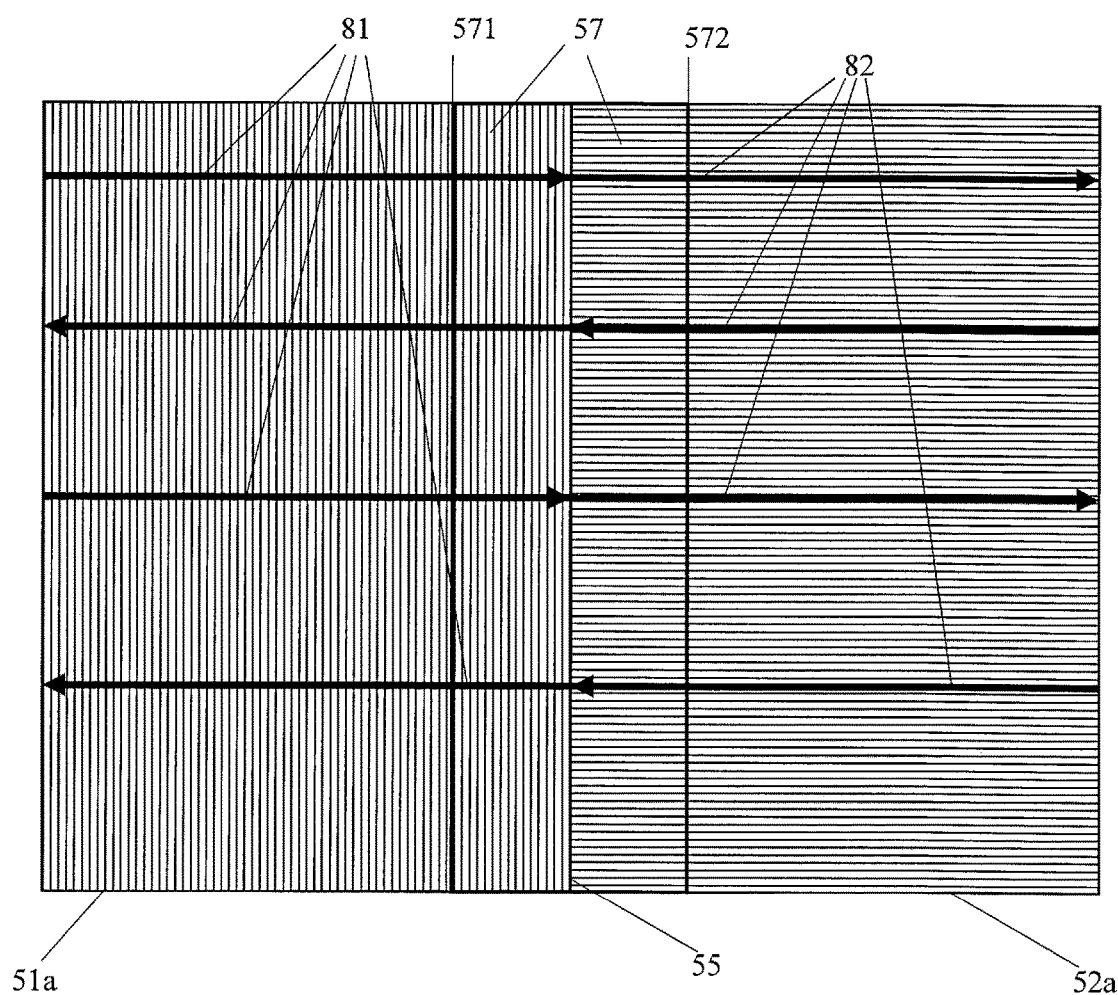
FIG. 4 schematically shows a horizontal cut similar to FIG. 3 for an illustration of an alternative approach.

The change may be made exactly at the border 55, meaning while the area of incidence of the energy beam is moved across the border 55. However, usually it will be sufficient to change an energy input parameter in a region close to the border, meaning a border region 57 as it is shown in FIG. 4. The width of this border region 57, meaning the maximum distance of the edges 571 and 572 of the border region 57 perpendicularly to the border 55, depends on the size of the partial region cross-sections 51a and 52a and on the type of energy input parameter that is changed. The layer thickness and the type of building material do also play a role. An indicative value for use in practice for the maximum distance is 1000 μm. However, in some cases a smaller maximum distance of only 100 μm may be appropriate while there may also be cases in which the maximum distance may have a value of up to 10,000 μm.

With regard to a solidification of the building material that is as uniform as possible when crossing from the first partial region 51 over to the second partial region 52 it is appropriate to alter energy input parameters that change when crossing from one partial region over to the other not abruptly but gradually. Such a gradual change can be implemented by changing an energy input parameter in at least two discrete steps or by changing it nearly continuously in a multitude of steps. Of course, an entirely continuous change is desirable. However, in practice there will always exist discrete minimal time steps within which a change may occur due to the inertia or response time of the mechanical and electrical components of the energy input unit.

Figure 5:
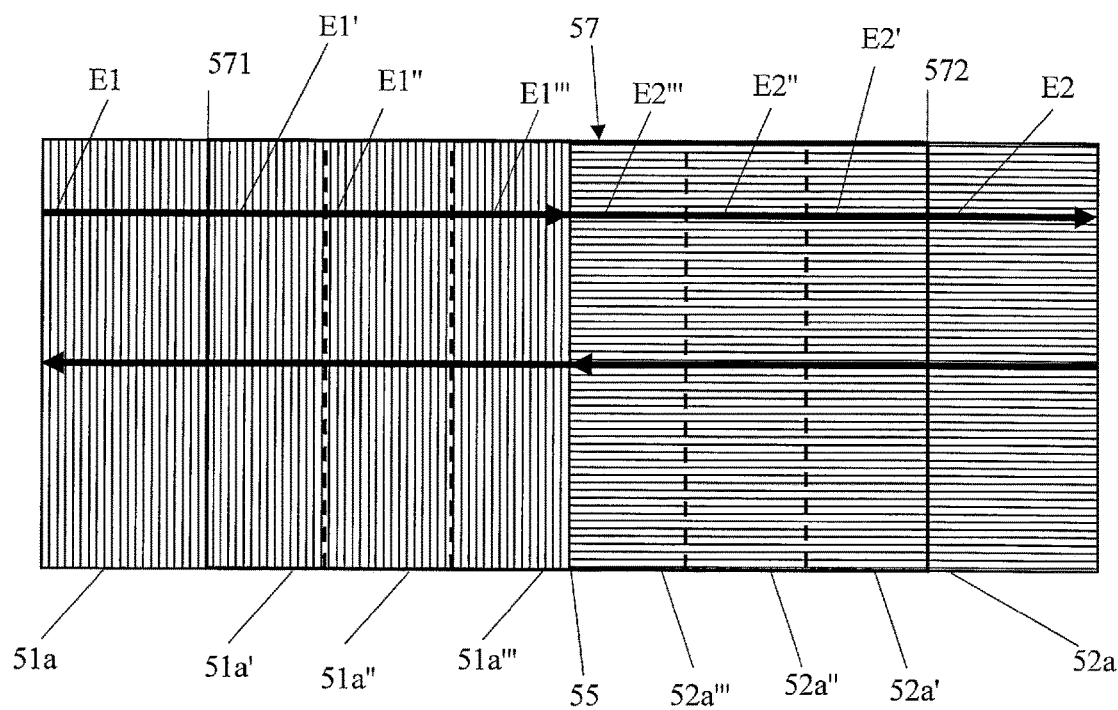
FIG. 5 schematically shows a horizontal cut similar to FIG. 3 for an illustration of a variation of the approach according to the invention.

FIG. 5 shows a more detailed illustration of the just described procedure. FIG. 5 shows a detail of FIG. 4, in which an area inside of the border region 57 is enlarged. Due to reasons of a more illustrative representation, in FIG. 5 the values of an energy input parameter that is changed are designated with E1, E1', E1", E1''', E2''', E2", E2', and E2. Outside of the border region the energy input parameter in the first partial region cross-section 51a has the value E1 and in the second partial region cross-section 52a has the value E2. Inside of the border region which in the figure is horizontally limited by the edges 571 and 572, the value of the energy input parameter is changed in steps, wherein in a transition from E1 to E1', E1' to E1", E1" to E1''', E1''' to E2", E2''' to E2", E2" to E2' and E2' to E2 in each case the value of the energy input parameter approaches the value E2. For the scanlines from right to left in FIG. 5 there is a corresponding transition in steps from the value E2 of the energy input parameter to the value E1 of the energy input parameter. However, for reasons of clarity, a detailed illustration of the corresponding energy input parameter values has been foregone for the scanlines running from right to left.

In FIG. 5, dashed lines can be seen that are in parallel to the edges 571 and 572 of the border region. Such dashed lines serve for an illustration of a specific embodiment of the invention. In this specific embodiment of the invention, two partial regions 51 and 52 in which the value of at least one energy input parameter is different, are not arranged immediately next to each other. Rather, additional intermediate partial region cross-sections are introduced in the respective cross-sections. In FIG. 5, these are the intermediate partial region cross-sections 51a', 51a", 51a''', 52a''', 52a" and 52a'. If it is again assumed that an energy input parameter in the partial region cross-section 51a has the value E1 and in the partial region cross-section 52a has the value E2, intermediate values between E1 and E2 can be assigned to these energy input parameters in the intermediate partial region cross-sections. As a result, the value of the energy input parameter is changed each time the energy beam is moved across a border between two (intermediate) partial region cross-sections, for example from the value E1" to the value E1''' when the energy beam is moved across the dashed border between the intermediate partial region cross-sections 51a" and 51a'. Of course, intermediate partial region cross-sections may not only be defined with respect to one cross-section but the segmentation unit 102 can determine in step S2 intermediate partial regions in order to provide for a smoother transition from the first partial region 51a to the second partial region 52a.

Figure 6:
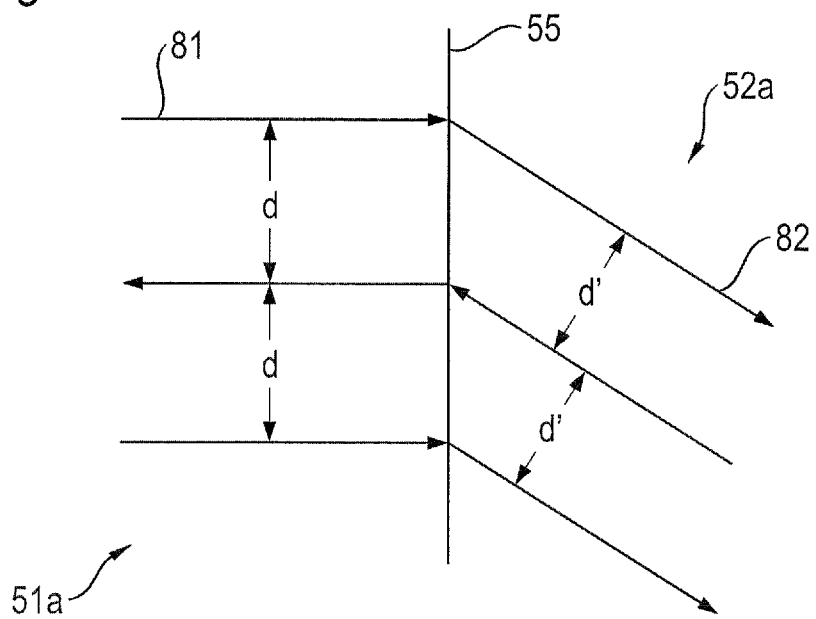
FIGS. 6 to 8 schematically show different possibilities of the approach for a case in which scan lines in a first and second partial region cross-section run in different directions.

While in each of the examples of FIGS. 3 to 5 the first scanlines 81 and the second scanlines 82 are running in the same direction, FIG. 6 shows an example, in which in the two partial region cross-sections 51a and 52a the scanlines in the first partial region cross-section 51a are running in a different direction than the ones in the second partial region cross-section 52a. In order to accommodate this, the direction of movement of the energy beam is changed when the area of incidence of an energy beam crosses the border 55. Here, the change of direction may be made while energy is input into the building material by the energy beam, meaning without interruption of the movement of the energy beam across the building material layer.

Figure 7:
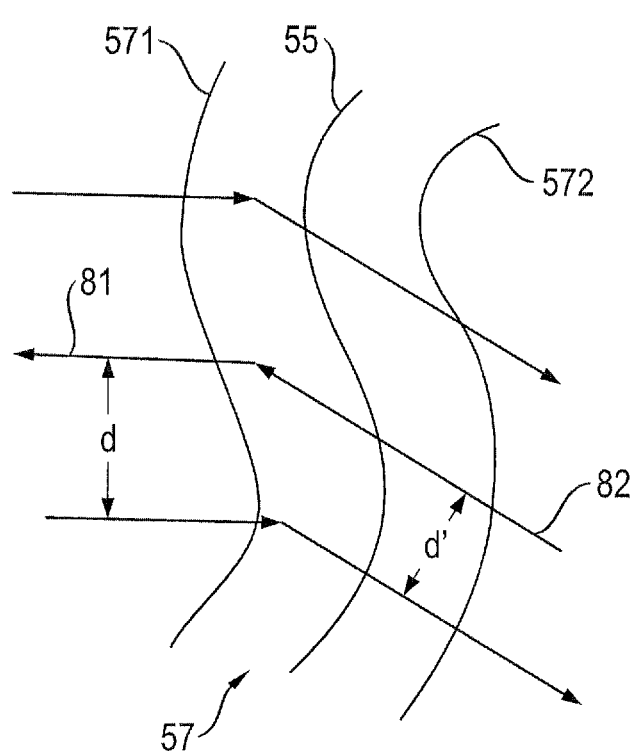

In particular for a curvilinear shape at the border 55 it can sometimes be difficult to change the direction of movement of the scanline(s) without having to accept variations of the distance of the scanlines from each other (hatch distance). In particular for such a case, it is appropriate to change the direction of the scanlines not immediately at the border 55 but in a border region 57 which was already introduced with respect to the examples of FIGS. 4 and 5. FIG. 7 shows an example for such an approach.

Figure 8:
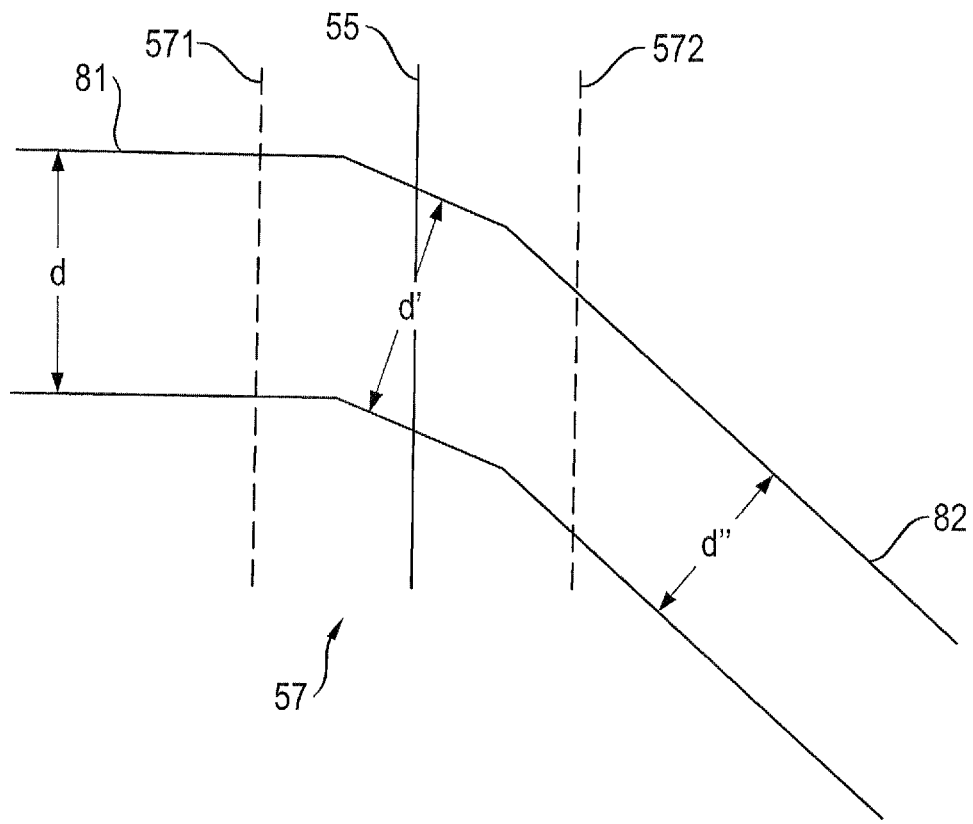

With regard to a solidification of the building material that is as uniform as possible, it is advantageous to change the direction of the scanlines not abruptly but gradually. This can be done in a border region in at least two discrete steps and in particular also in a plurality of small steps in order to be able to achieve a continuous change of the direction of movement. Here, FIG. 8 shows by way of example a change of the direction of the scanlines that is made twice. Here, inside of the border region 57 a direction is changed between the edge 571 of the border region and the border 55 and a direction is changed between the edge 572 of the border region and the border 55. The first scanlines 81 in the first partial region cross-section 51a outside of the border region 57 have the distance d and the second scanlines in the second partial region cross-section 52a have the distance d" outside of the border region 57. Between the two changes of the direction inside of the border region 57 the scanline distance is d'. A change of the direction of the scanlines in several steps in particular has the advantage that the angle by which the direction of movement is changed is small and does not exceed a predefined maximum value, for example 30°, 10°, 5° or 1°. In particular, such a maximum angle can be dictated by the inertia of the deflection device 23.

Figure 9:
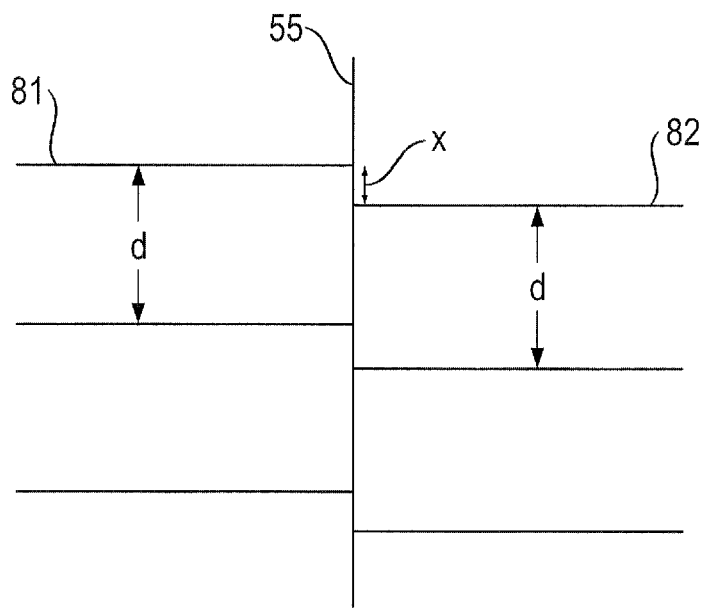
FIG. 9 schematically shows the approach for a scanline displacement.

When the direction of movement of the energy beam changes, due to geometrical reasons also the distance between neighboring scanlines that are running in parallel to each other, changes. This can be seen in FIG. 6 where the scanline distance d in the first partial region cross-section (51a) differs from the scanline distance d' in the second partial region cross-section (52a). When an energy beam is moved across a border 55 between a first partial region cross-section 51a and a second partial region cross-section 52a, preferably a scanline displacement at the border should not exceed a predetermined maximum value. The situation is illustrated in FIG. 9. For reasons of simplicity, in FIG. 9 the first scanlines 81 are in parallel to the second scanlines 82. It can be seen that the scanline distance d between the scanlines 81 equals the scanline distance between the second scanlines 82 and that there is a scanline displacement x immediately at the border 55. Preferably, the maximum displacement of scanlines should be smaller than half of the distance of the first scanlines with respect to each other or the second scanlines with respect to each other. In particular, the maximum displacement can be chosen taking into consideration the inertia of the beam deflection device.

Figure 12:
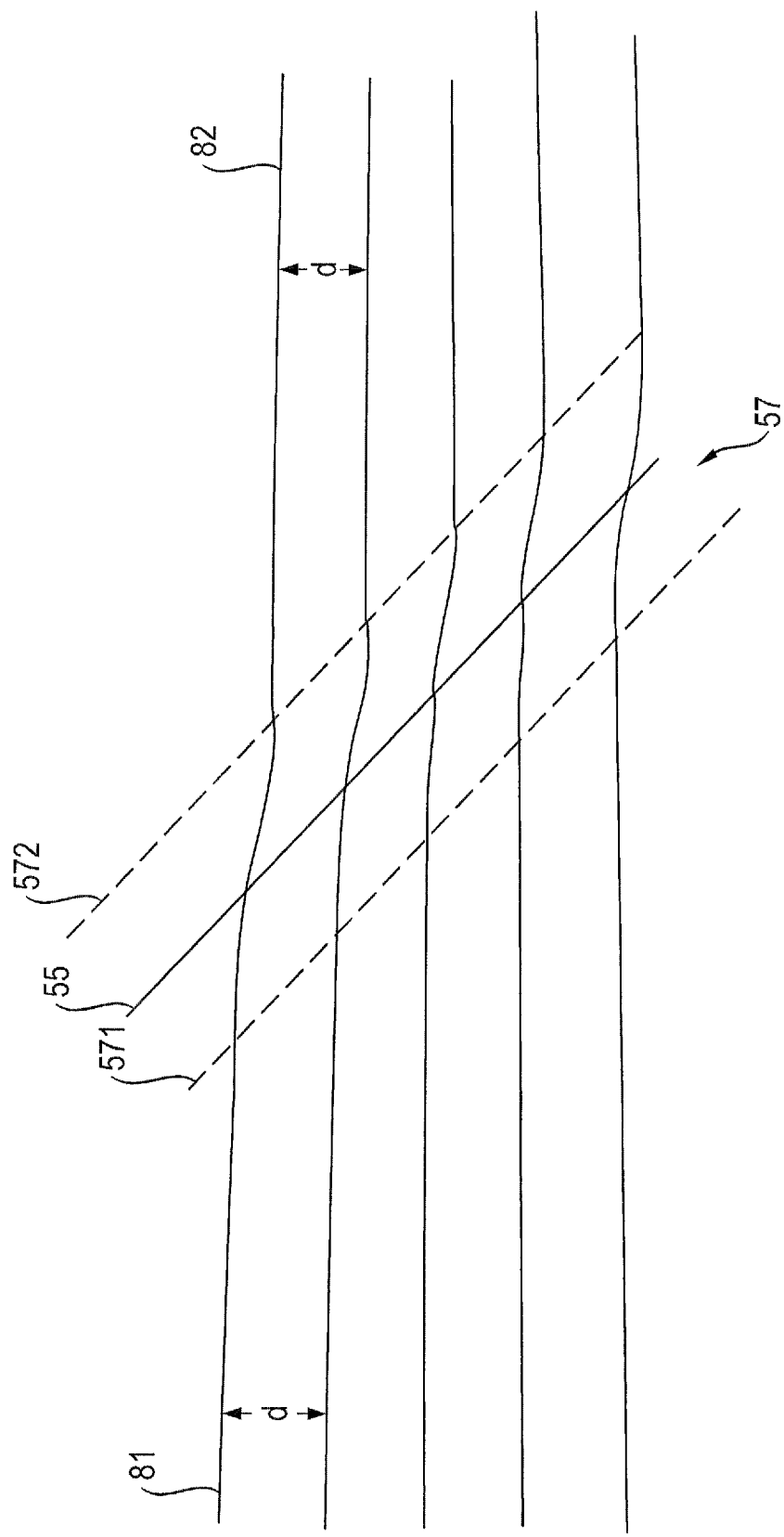
FIG. 12 shows an exemplary approach for avoiding an abrupt displacement of scanlines immediately at the border and FIG. 13 shows a specific embodiment of the invention.

In the example shown in FIG. 12, an abrupt displacement of the scanlines immediately at the border 55 is avoided by a gradual displacement of the scanlines, i.e. in several steps, inside of the border region 57. Specifically, in FIG. 12 the position of the scanlines is continuously changed in the vertical direction in the drawing plane.

Figure 13:
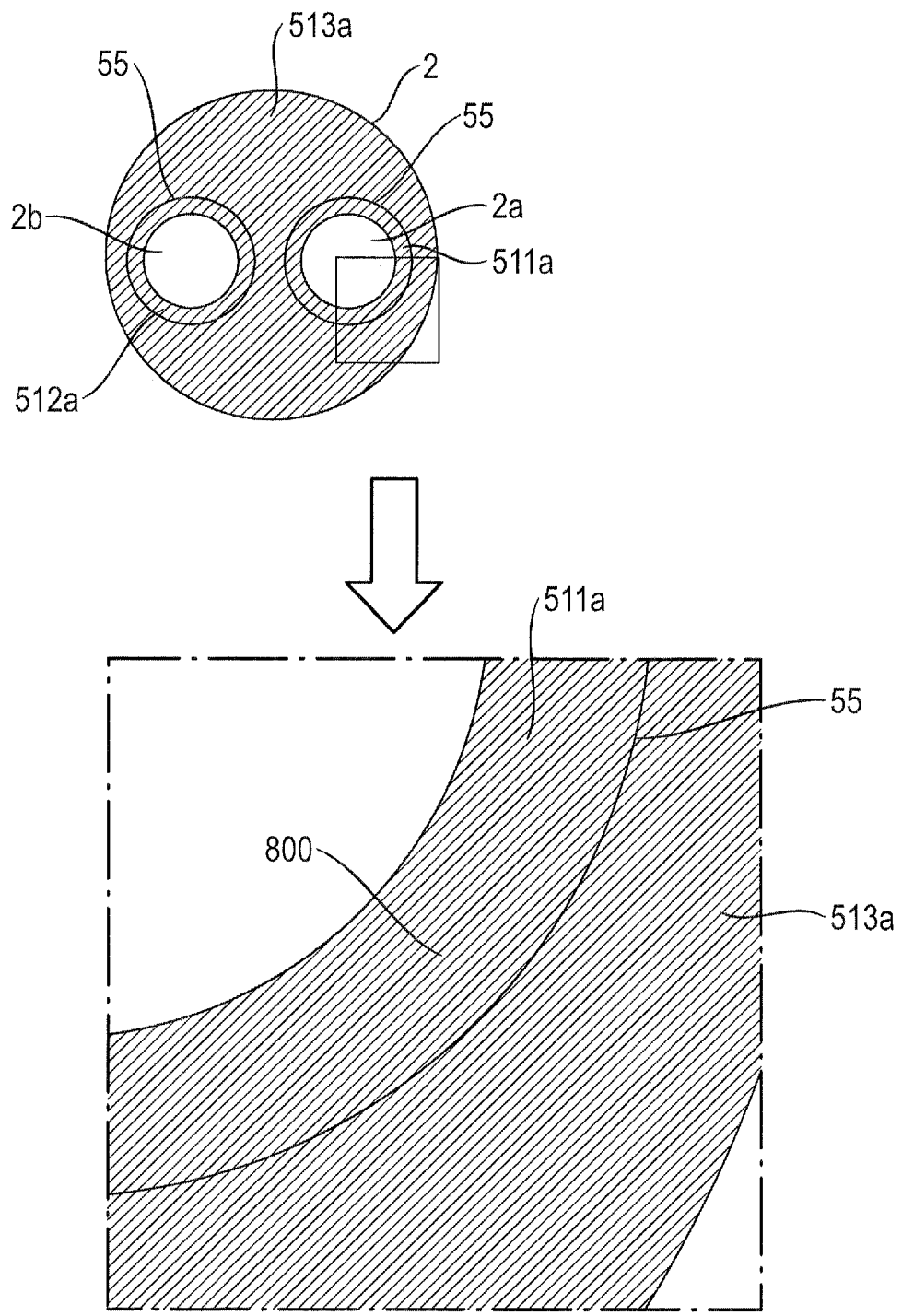

In the following an embodiment will be described in which the advantages of the inventive approach become particularly apparent. FIG. 13 shows in its upper half a horizontal cut through a cylindrical object 2 to be manufactured which has two cylindrical hollows 2a and 2b. In such an object 2, the walls of the cylindrical hollows must be manufactured with particular precision as a post-processing of these walls after the completion of the object 2 is difficult. As the rest of the object need not be manufactured with such a high precision, when providing the control data for the additive manufacturing apparatus, a CAD model of the object 2 at first is divided into a first partial region 511 containing the wall of the cylindrical hollow 2a, a second partial region 512 containing the wall of the cylindrical hollow 2b and a third partial region 513 containing the rest of the object 2. FIG. 13 reflects the segmentation into the partial region cross-sections 511a, 512a and 513a.

For achieving a high precision, a layer thickness of e.g. 20 µm is specified for the building material layers in the partial regions 511 and 512, whereas in the partial region 513, which need not be manufactured with such a high precision, a layer thickness of e.g. 40 µm is specified. This means for the manufacture of the object 2 that the building material layers are applied with the smaller layer thickness of 20 µm, wherein in the partial regions 511 and 512 the building material is solidified after each layer application, however, in the partial region 513 it is solidified only after each second layer application. In doing so, in the solidification in the partial region 513 there must be supplied to the building material sufficient energy to solidify the building material of two layers each having 20 µm when it is scanned.

This means for the provision of control data that in the data models of half of the layer datasets a solidification is specified only in the partial regions 511 and 512 but not in the partial region 513. In the data models of the other half of layer datasets a solidification is specified in all partial regions 511, 512 and 513, however, with an energy input per unit area which on average is different in the partial region 513 from the one in the partial regions 511 and 512. In those data models in which a solidification is specified in all partial regions 511, 512 and 513, it is specified that the energy to be supplied per unit area is changed when the border 55 between the partial regions 511 and 513 or 512 and 513 is crossed with the energy beam, e.g. a laser, in order to comply with the requirements in the other partial region. Nevertheless, there is substantially no interruption of the energy supply by the energy beam to the building material when the border is crossed. For an illustration of the approach, the lower half of FIG. 13 shows an enlarged view of the square-shaped section of the object cross-section shown in the upper half of FIG. 13.

In the case of FIG. 13, the hatching lines represent the scanlines when the object cross-section is scanned. It can be seen that for example each scanline that crosses the border 55 at the cross markers is traversed in one go at first in the partial region cross-section 513a, then in the partial region cross-section 511a and then again in the partial region cross-section 513a.

Thus in the embodiment that is shown in spite of different layer thicknesses in the different partial regions of the object it is nevertheless possible to provide for a solidification as uniform as possible at the transition between partial regions.

Finally, it shall be mentioned that a device 100 for providing control data for an additive manufacturing apparatus can be implemented not exclusively by software components but also exclusively by hardware components or mixtures from hardware and software. In particular, interfaces that are mentioned in the present application need not necessarily be configured as hardware components, but can also be implemented as software modules, for example when the data that are input or output via the same can be taken over from other components that are implemented in the same device or need to be transferred to another component only by software. Also, the interfaces could consist of hardware components and software components, such as a standard hardware interface that is specifically configured by software for a specific application. Furthermore, a plurality of interfaces can be combined into a common interface such as an input-output interface.

What is claimed:

1. A computer-based method of providing control data for an additive manufacturing apparatus for manufacturing a three-dimensional object, the additive manufacturing apparatus being capable of manufacturing the object by applying a building material in layers and solidifying the building material by supplying radiant energy in each of the layers at positions that are assigned to a cross-section of the object in the layer, wherein an energy input unit scans the positions with an energy beam so that energy is input into the building material according to a set of energy input parameters, wherein the method comprises:

a first step of accessing computer-based model data of at least one portion of the object to be manufactured;

a second step of determining a first partial region and a second partial region inside of the at least one object portion, the first partial region and second partial region abutting each other at a border;

a third step of generating a data model of a region of a building material layer to be selectively solidified by scanning the positions in the region with the energy beam in order to manufacture the at least one object portion, the data model comprising in which a first partial region cross-section is cutting the first partial region and a second partial region cross-section is cutting the second partial region, wherein it is specified in the data model that:

in the first partial region cross-section at least one of the energy input parameters on average has a first value, and in the second partial region cross-section at least one of the energy input parameters has a second value different than the first value, the positions of the first and second partial cross-sections being scanned with the same energy beam; and the energy beam is moved across the border at least once while inputting energy into the building material by the energy beam; such that the value of the at least one energy input parameter is changed inside of a border region, the border region being a region on at least one side of the border in the building material layer described by the data model; and a fourth step of providing control data for the generation of a control dataset for the additive manufacturing apparatus, the control data corresponding to the data model generated in the third step.

2. The method of claim 1, wherein in the first step model data are accessed that comprise a number of layer datasets, wherein each layer dataset comprises a data model of a region of the layer to be selectively solidified during the manufacturing, the region corresponding to a cross-section of the object portion.

3. The method of claim 1, wherein the positions to be solidified in the border region having a maximum distance of 2000 µm to the border.

4. The method of claim 1, wherein the value of the at least one energy input parameter is changed immediately when crossing the border.

5. The method of claim 1, wherein the value of the at least one energy input parameter is gradually changed inside of the border region.

6. The method of claim 1, wherein the energy beam scans the building material in the first partial region cross-section along first scan lines and scans the building material in the second partial region cross-section along second scan lines, wherein in the border region, first scan lines in the first partial region cross-section extend in the same direction as second scan lines in the second partial region cross-section.

7. The method of claim 1, wherein the energy beam scans the building material in the first partial region cross-section along first scan lines and scans the building material in the second partial region cross-section along second scan lines, wherein in the border region, the first scan lines and the second scan lines are at an angle relative to one another that is different from 0°.

8. The method of claim 7, wherein the directions of the first scan lines and/or of the second scan lines are gradually changed inside of the border region.

9. The method of claim 1, wherein the energy beam scans the building material in the first partial region cross-section along first scan lines and scans the building material in the second partial region cross-section along second scan lines; and wherein in the border region the first scan lines and/or the second scan lines are displaced by an amount that is smaller than half a pitch of the first scan lines or the second scan lines.

10. The method of claim 1, wherein the energy beam scans the building material in the first partial region cross-section along first scan lines and scans the building material in the second partial region cross-section along second scan lines, wherein a pitch of the first scan lines in the first partial region cross-section equals a pitch of the second scan lines in the second partial region cross-section.

11. The method of claim 1, wherein data models of n+1 consecutive building material layers are generated, n being a natural number, wherein in the data models of n consecutive building material layers a scanning of the building material with the energy beam is specified only in the first partial region cross-section but not in the second partial region cross-section and in the data model of the following (n+1)-th building material layer a scanning of the building material in the first partial region cross-section and in the second partial region cross-section is specified.

12. The method of claim 1, further comprising controlling the process of manufacturing the three-dimensional object by the generated control dataset.

* * * * *